United States Patent
Korobov et al.

(10) Patent No.: US 9,502,457 B2
(45) Date of Patent: Nov. 22, 2016

(54) GLOBAL SHUTTER IMAGE SENSOR PIXELS HAVING CENTRALIZED CHARGE STORAGE REGIONS

(71) Applicant: SEMICONDUCTOR COMPONENTS INDUSTRIES, LLC, Phoenix, AZ (US)

(72) Inventors: Vladimir Korobov, San Mateo, CA (US); Jaroslav Hynecek, Allen, TX (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 155 days.

(21) Appl. No.: 14/608,366

(22) Filed: Jan. 29, 2015

(65) Prior Publication Data

US 2016/0225803 A1    Aug. 4, 2016

(51) Int. Cl.
*H01L 27/146* (2006.01)
*H01L 27/148* (2006.01)

(52) U.S. Cl.
CPC ....... *H01L 27/1464* (2013.01); *H01L 27/1463* (2013.01); *H01L 27/14607* (2013.01); *H01L 27/14627* (2013.01); *H01L 27/14634* (2013.01); *H01L 27/14636* (2013.01); *H01L 27/14641* (2013.01); *H01L 27/14643* (2013.01); *H01L 27/14806* (2013.01)

(58) Field of Classification Search
CPC ............ H01L 27/1464; H01L 27/14607; H01L 27/14636; H01L 27/14634
USPC ...................................... 250/208.1
See application file for complete search history.

(56) References Cited

U.S. PATENT DOCUMENTS

| | | |
|---|---|---|
| 5,625,210 A | 4/1997 | Lee et al. |
| 6,657,665 B1 | 12/2003 | Guidash |
| 7,705,900 B2 * | 4/2010 | Guidash ............ H01L 27/14643 250/208.1 |
| 8,208,054 B2 * | 6/2012 | Yamaguchi ....... H01L 27/14603 348/272 |
| 8,314,866 B2 | 11/2012 | Massetti |
| 8,535,996 B2 | 9/2013 | Shaheen et al. |
| 8,723,284 B1 * | 5/2014 | Hynecek ............... H01L 31/103 257/228 |
| 8,917,341 B2 * | 12/2014 | Sakano .............. H04N 5/37452 250/208.1 |
| 2009/0201400 A1 | 8/2009 | Zhang et al. |
| 2010/0276574 A1 | 11/2010 | Manabe |
| 2012/0273653 A1 | 11/2012 | Hynecek |

(Continued)

OTHER PUBLICATIONS

Hynecek, U.S. Appl. No. 14/554,914, filed Nov. 26, 2014.

(Continued)

*Primary Examiner* — Seung C Sohn
(74) *Attorney, Agent, or Firm* — Treyz Law Group, P.C.; Michael H. Lyons

(57) ABSTRACT

An image sensor may be provided with an array of image pixels formed on a substrate having front and back surfaces. Each pixel may have a photodiode that receives light through the back surface, a floating diffusion node, and a charge transfer gate. The floating diffusion node may be formed in the center of the photodiode and may be surrounded by the charge transfer gate at the front surface. The charge transfer gate may isolate the floating diffusion node from the surrounding photodiode. The pixel may include reset transistor gates, an addressing transistor gate, and a source follower transistor arranged about the periphery of the photodiode. By centering the floating diffusion node and charge transfer gate within the photodiode, the image pixels may have improved shutter efficiency and charge transfer efficiency relative to pixels having floating diffusion nodes at non-centralized locations.

20 Claims, 4 Drawing Sheets

(56) References Cited

U.S. PATENT DOCUMENTS

| | | |
|---|---|---|
| 2012/0273654 A1 | 11/2012 | Hynecek et al. |
| 2013/0153973 A1 | 6/2013 | Hynecek |
| 2014/0077062 A1 | 3/2014 | Hynecek |
| 2014/0077283 A1 | 3/2014 | Lenchenkov |
| 2014/0085523 A1 | 3/2014 | Hynecek |

OTHER PUBLICATIONS

Hynecek, U.S. Appl. No. 14/553,822, filed Nov. 25, 2014.
Hynecek, U.S. Appl. No. 14/553,829, filed Nov. 25, 2014.
Yasutomi et al., "A 2.7e- Temporal Noise 99.7% Shutter Efficiency 92dB Dynamic Range CMOS Image Sensor with Dual Global Shutter Pixels", International Solid-State Circuits Conference, Session 22, Image Sensors, 2010 IEEE, Feb. 10, 2010.
Takayanagi et al., "A Four-Transistor Capacitive Feedback Reset Active Pixel and its Reset Noise Reduction Capability", Advances Technology Research Center.
"Sony Develops Next-generation Back-Illuminated CMOS Image Sensor which Embodies the Continuous Evolution of the Camera", Sony Corp. Info, [online], Jan. 23, 2012. <http://www.sony.net/SonyInfo/News/Press/201201/12-009E/ >.

\* cited by examiner

GLOBAL SHUTTER IMAGE SENSOR PIXELS HAVING CENTRALIZED CHARGE STORAGE REGIONS

BACKGROUND

This relates to solid-state image sensor arrays and, more specifically, to image sensors with small-size pixels that are illuminated from the back side of a pixel substrate. Small pixel sizes reduce the cost of manufacturing image sensor arrays, but it is important not to sacrifice image sensor performance when pixel size is reduced.

Typical complementary metal-oxide-semiconductor (CMOS) image sensors sense light by converting impinging photons into electrons that are integrated (collected) in sensor pixels. Upon completion of each integration cycle, the collected charge is converted into voltage signals, which are supplied to corresponding output terminals associated with the image sensor. Typically, the charge-to-voltage conversion is performed directly within the pixels, and the resulting analog pixel voltage signals are transferred to the output terminals through various pixel addressing and scanning schemes. The analog voltage signal can sometimes be converted on-chip to a digital equivalent before being conveyed off-chip. Each pixel includes a buffer amplifier (i.e., source follower) that drives output sensing lines that are connected to the pixels via respective address transistors.

After the charge-to-voltage conversion is completed and after the resulting signals are transferred out from the pixels, the pixels are reset before a subsequent integration cycle begins. In pixels that include floating diffusions (FD) serving as the charge detection node, this reset operation is accomplished by momentarily turning on a reset transistor that connects the floating diffusion node to a voltage reference for draining (or removing) any charge transferred onto the FD node. However, removing charge from the floating diffusion node using the reset transistor generates thermal kTC-reset noise, as is well known in the art. This kTC reset noise must be removed using correlated double sampling (CDS) signal processing techniques in order to achieve desired low noise performance. Typical CMOS image sensors that utilize CDS require at least four transistors (4T) per pixel. An example of the 4T pixel circuit with a pinned photodiode can be found in Lee (U.S. Pat. No. 5,625,210), incorporated herein as a reference.

One primary disadvantage of conventional CMOS image sensors is that pixel scanning after charge has been accumulated in the pixels is performed in a sequential manner row-by-row. This generates exposure time skew, which is often observed as distortion in images of moving objects. Scanning the pixels row-by-row is referred to as operating the sensor in a "rolling shutter" mode, which resembles the action of a focal plane slit shutter found in conventional photographic film cameras. In most applications, however, it is preferable to expose all of the pixels of the array at the same time without exposure time skew to thereby eliminate distortion of moving objects in the image. This type of image sensor operation is referred to as "global shuttering" (GS) which resembles the operation of a mechanical iris shutter in conventional photographic film cameras. In order to implement this type of global shuttering, it is necessary to provide multiple charge storage sites in each sensor pixel.

After charge is integrated in photodiodes of the pixels when operating in a GS scheme, charge is transferred to pixel storage sites simultaneously in all of the pixels of the array, where charge can wait for scanning in a row-by-row fashion. The pixel scanning time skew is thus independent of the frame pixel exposure time. Examples of methods for incorporating multiple charge storage sites into the CMOS sensor pixels can be found in Yasutomi et al. (ISSCC Digest of Technical Papers, Feb. 10, 2010, pp. 398 and 399, entitled "A 2.7e Temporal Noise 99.7% Shutter Efficiency 92 dB Dynamic Range CMOS Image Sensor with Dual Global Shutter Pixels"), which is incorporated herein as a reference. The arrangement of Yasutomi et al. is a modification of the conventional Interline Transfer Charge Coupled Device (CCD) concept where charge from the pixel photodiodes is transferred first into vertical CCD registers located in the spaces between the pixels, and then from there charge is transferred in parallel fashion row-by-row into a serial register followed by a CCD charge transfer into a common single charge detection node and output amplifier. This application of the CCD charge transfer concept into CMOS sensors to implement global shuttering is shown in FIG. 1, where charge is stored in an additional pinned diode.

FIG. 1 shows a simplified circuit diagram of a pixel 100 in a CMOS sensor that has global shuttering capabilities. After charge integration is completed in first pinned photodiode 101, charge is transferred via charge transfer transistor 103 to second pinned diode 102. The transferred charge waits in diode 102 for scanning The charge transfer from first diode 101 to second diode 102 is complete in a CCD fashion without generating kTC noise. It is also necessary that either second diode 102 has a higher pinning voltage than diode 101, or transfer gate 103 has a potential barrier and a potential well. Moreover, it is necessary that the second diode 102 is well shielded from impinging photons 115 (i.e., the photons used to generate charge at first diode 101) to prevent undesirable smear effects when objects in the imaged scene move. The light shielding effect is characterized in such image sensors by a parameter referred to as shutter efficiency.

Signal charge readout operations form second diode 102 proceeds in a conventional manner by first resetting floating diffusion (FD) node 104 to drain bias voltage Vdd by momentarily turning on reset transistor 106, followed by pulsing the gate of charge transfer transistor 105. This sequence can now proceed in a sequential order row-by-row through the array. The signal appearing on floating diffusion 104 is buffered by source follower transistor 107 that is addressed by row addressing transistor 108. The pulses to control transfer transistor gates 103 and 105, reset transistor 106, and addressing transistor 108 are supplied by row bus lines 111, 112, 113, and 114, respectively (i.e., coupled to row control circuitry in the image sensor). Bias voltage Vdd is supplied to the pixels by column Vdd line 109 and the signal output appears on the column output line 110. Using the pinned diodes for charge storage in this way is advantageous because the diodes of this type have relatively low dark current generation characteristics (high levels of dark current in the charge storage regions can add noise and generate undesirable shading effects in the image). However, second diode 102 consumes a significant amount of pixel area, thus increasing the size of the corresponding image sensor and, ultimately, its cost. Another disadvantage of the pinned photodiode storage approach is the higher pinning voltage necessary for second diode 102 relative to the pinning voltage for diode 101. This higher pinning voltage consumes a valuable allocated voltage swing that is determined by the maximum device operating voltage and results in reduction of charge storage capacity, and thus the dynamic range (DR) of the image sensor.

The above-noted problems in the design of global shuttered pixels can be partially overcome in Front Side Illumination (SFI) applications, where a light shield can be placed over second pinned charge storage diode 102 to prevent light leakage into diode 102. However, such methods are counterproductive in Back Side Illumination (BSI) applications. In particular, a light shield placed on the back side of the sensor substrate in a BSI application is less efficient than in front side applications and limits the quantum efficiency (QE) of the sensor (a high quantum efficiency is a primary purpose for using back side illumination in small size pixel sensors). Therefore, it is not viable to use second pinned diode 102 for charge storage in a BSI application.

It would therefore be desirable to be able to provide improved back side illuminated image sensor pixels with global shutter capabilities.

DETAILED DESCRIPTION

Figure 2:
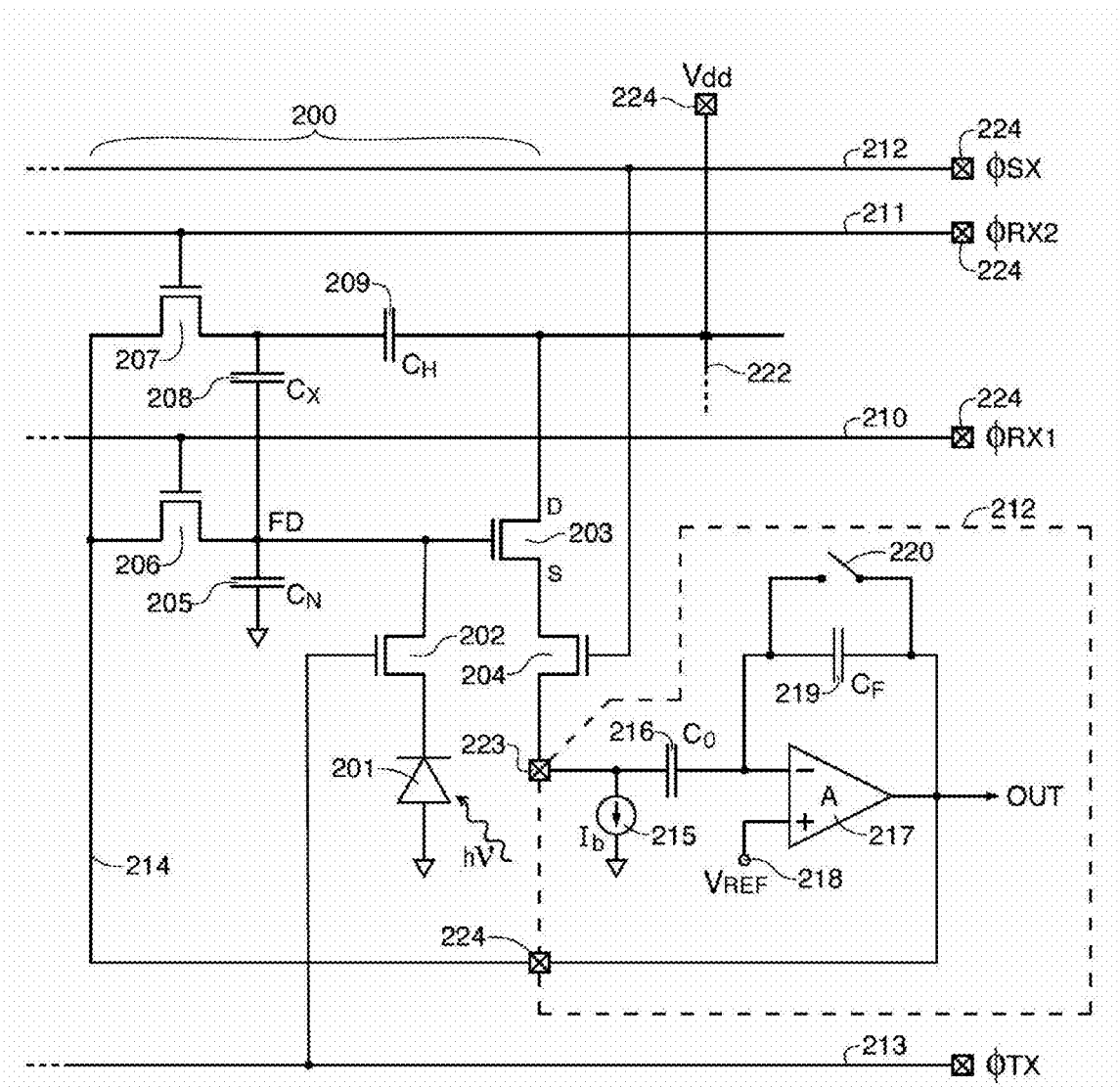
FIG. 2 is an illustrative circuit diagram of a global shutter image sensor pixel having a floating diffusion region, pixel column feedback, and a floating diffusion double reset circuit for optimizing area, voltage swing, and efficiency while minimizing kTC noise generation relative to pixels of the type shown in FIG. 1 in accordance with an embodiment of the present invention.

A simplified circuit diagram of an illustrative global shutter image pixel is shown in FIG. 2. As shown in FIG. 2, pixel 200 may include a photodiode 201 that senses incoming light hv (e.g., light having frequency v) and converts the light to electric charge (e.g., that generates charge in response to image light). Photodiode 201 may be coupled to a charge detection node such as node 205 (e.g., represented by node capacitor 205 having capacitance $C_N$) through charge transferring transistor 202. Charge detection node capacitor 205 may, if desired, include one or more additional capacitors coupled to the node to increase the charge storage capacity of the node (e.g., one or more dual conversion gain capacitors, etc.). Node capacitor 205 may be coupled to the gate terminal of source follower transistor 203. Source follower 203 may have a drain terminal connected to drain column bus line 222 (e.g., the column line 222 on which bias voltage Vdd is received from via 224) and a source terminal coupled to column sense line 223 (sometimes referred to herein as read out line 223) through addressing transistor 204.

Charge detection node 205 (sometimes referred to herein as floating diffusion node 205, floating diffusion junction region 205, floating diffusion junction 205, charge storage node 205, charge storage region 205, or floating diffusion region 205 and which may be implemented (and as is represented in the schematic) as a capacitive element in or on a semiconductor pixel substrate or as a doped region of the semiconductor substrate) may be reset via reset transistor 206 to a reset reference voltage produced at the output of column amplifier 217 via column voltage reference line 214. Similarly, reset transistor 207 resets the holding capacitor 209 to a reference voltage provided by amplifier 217 via column line 214. Row control circuitry (not shown) may generate row control signals for pixel 200 (e.g., charge transfer control signals, pixel reset control signals, addressing or row select control signals, etc.). For example, reset transistor 206 may receive reset control signals $\phi_{RX1}$ over row control line 210 whereas reset transistor 207 may receive reset control signals $\phi_{RX2}$ over row control line 211 (e.g., reset transistor 206 may reset node 205 and reset transistor 207 may reset holding capacitor 209 to a reset voltage as provided by the output of amplifier 217 when reset signals $\phi_{RX1}$ and $\phi_{RX2}$ are pulsed high, respectively). Addressing transistor 204 (sometimes referred to herein as row select transistor 204) may receive row select control signals $\phi_{SX}$ via row control line 212 (e.g., row select control signals that are pulsed to select a desired row of pixels for read out (scanning)). Charge transfer transistor 202 may be controlled by charge transfer control signals $\phi_{TX}$ received over row control line 213 (e.g., when control signal $\phi_{TX}$ is pulsed, charge may be transferred from node photodiode 201 to node 205).

Pixel 200 may be formed in an array of image pixels arranged in rows and columns on a common image sensor semiconductor substrate (e.g., an integrated circuit substrate). Transistors such as transistors 206, 207, 203, and 202 of FIG. 2 may be formed on a first surface (front side) of the substrate. Image light may be received by photodiode 201 through a second surface (back side) of the substrate that opposes the first surface. Pixel 200 may thereby sometimes be referred to as a back side illuminated (BSI) image sensor pixel. BSI image sensor pixels may have improved quantum efficiency relative to front side illuminated (FSI) image sensor pixels, for example.

Pixels 200 in the array may be coupled to column feedback amplifier circuitry 221 (e.g., via readout path 223 and line feedback path 214). Column feedback amplifier circuitry 221 may be formed on a common semiconductor substrate (e.g., integrated circuit) as pixel 200 or may, if desired, be formed on a separate substrate from pixel 200 (e.g., a second integrated circuit chip to which the pixel array integrated circuit chip is attached). For example, amplifier 221 may be formed on a second substrate that is stacked vertically with respect to the substrate of pixel 200 (e.g., that is attached to the front side of the substrate on which pixel 200 is formed). The integrated circuit substrate on which pixels 200 are formed may be coupled to the integrated circuit substrate on which column amplifier circuitry 221 is formed by electrical interconnects such as through via 224 (e.g., metal via extending between the integrated circuit substrates or through-silicon via extending through a common integrated circuit substrate from the pixel to the column amplifier circuitry in scenarios where pixels 200 and column amplifier circuitry 221 are formed on the same semiconductor substrate). Each pixel 220 in a selected row of the corresponding pixel array may be coupled to a corresponding amplifier circuit 221 at a given time (e.g., a number of amplifier circuits 221 may amplify signals from corresponding pixels of a first row of pixels while that row is selected, may subsequently amplify signals from a second row of pixels that is selected, etc.).

Amplifier circuitry 221 may include amplifier circuits such as operational amplifier 217, pixel current source bias generator 215, coupling capacitor 216 (e.g., having capacitance $C_0$) coupled between current source 215 and a first (negative) input of amplifier 217, and feedback capacitor 219 (e.g., having capacitance $C_F$) coupled between the first input of amplifier 217 and the output of amplifier 217. Amplifier 217 may have a second (positive) input coupled to reference voltage $V_{REF}$ received over terminal 218. Amplifier 217 may be reset using reset switch 220 coupled across feedback capacitor 219.

Pixel 200 and column amplifier circuitry 221 may perform double reset operations to mitigate reset noise such as kTC-reset noise. For example, pixel 200 may perform double reset operations using first reset transistor 206 and second reset transistor 207. First reset transistor 206 of a selected row of pixels 200 may be pulsed on and off (e.g., using reset signals provided by row control circuitry) while second reset transistor 207 is held on and released only after the error correction signal corresponding to the first reset error is received from the amplifier 217. After completion of this double reset action, charge transfer transistor 202 is pulsed, transferring the sensed signal in a global transfer fashion of integrated charge from photodiodes 201 to node 205, and the transferred charge is sampled using CDS circuitry coupled to node 223 (not shown for the sake of simplicity). After sensing and processing the desired signal, node 205 may be reset again. This may remove signal charge from capacitor 205 while introducing kTC-reset noise on charge detection node 205. However, the feedback signal generated at the output of amplifier 217 may serve as a correcting voltage (e.g., a kTC-reset noise compensation voltage) that is stored on holding capacitor 209 (e.g., a capacitor having capacitance $C_H$) while second reset transistor 207 is turned on (e.g., during the double reset operation). Second reset transistor 207 and holding capacitor 209 may each be coupled to charge detection node 205 via coupling capacitor 208 (e.g., a capacitor having capacitance $C_X$). This process may compensate for kTC-reset noise error and, depending on the values of the capacitances in pixel 200, may almost completely eliminate the kTC-reset noise error. Second reset transistor 207 may subsequently be turned off after the correcting voltage has been stored on holding capacitor 209. Holding capacitor 209 may be connected between node 208 and Vdd line node 222 or alternatively between node 208 and ground or any other desired voltage reference node.

The kTC-reset error of compensation voltage transferred to and held on holding capacitor 209 by this action may be negligible if holding capacitance $C_H$ is sufficiently large. The voltage at column sense line 223 or at the amplifier output after the reset operation is subsequently sensed and processed by the column CDS circuit (not shown). The CDS circuit may eliminate pixel fixed pattern noise that is generated by variations in the threshold voltage of the pixel source follower transistors and other variances in circuit component values of pixel 200. Amplifier circuit 217 may subsequently be reset to reference voltage $V_{REF}$ by pulsing reset switch 220 to short opposing sides of capacitor 219. This prepares amplifier circuitry 221 for sensing a signal from the next row of pixels in the pixel array, which may be initiated by turning on pixel row select transistors 204 in the next row of the array.

Figure 1:
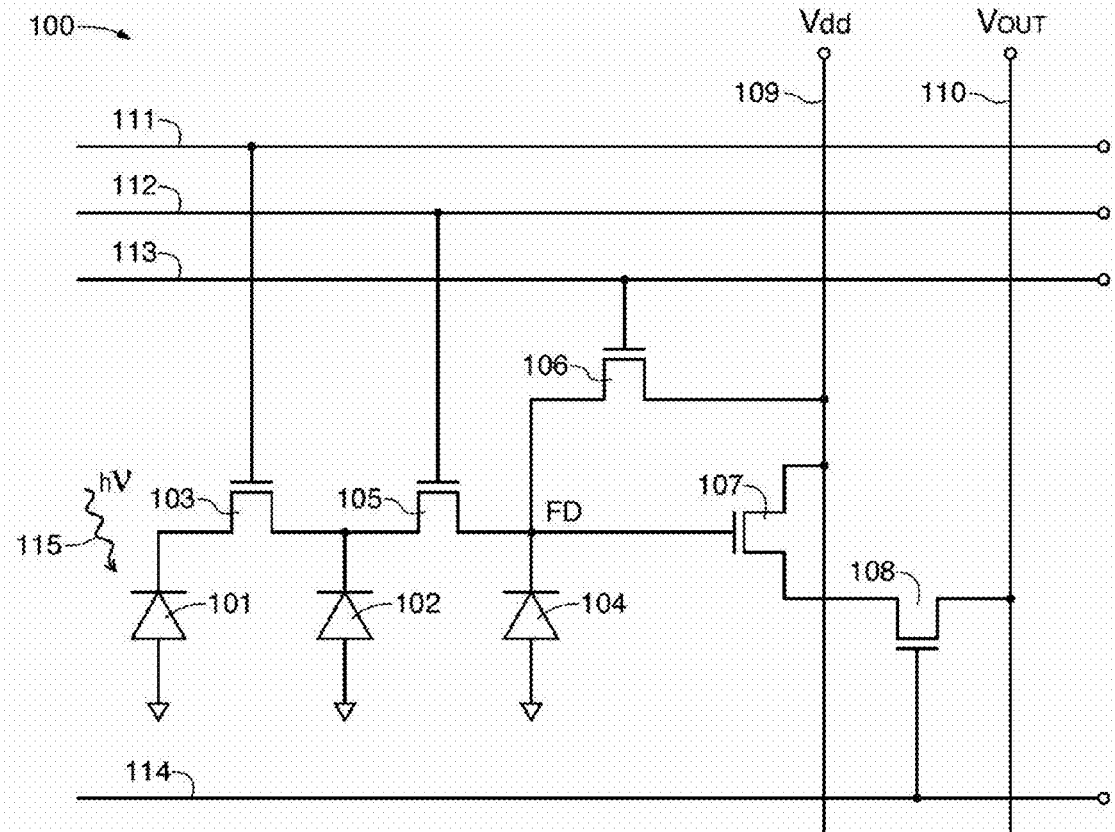
FIG. 1 is a simplified circuit diagram of a conventional global shutter image sensor pixel having a light sensing photodiode and a pinned diode for charge storage.

This example of FIG. 2 is merely illustrative. If desired, other timing variations may be applied to this readout sequence. For example, amplifier 217 may be reset at different times, which may be useful to simplify operation. If desired, amplifier 217 may be reconfigured to provide a different desired gain while the signal charge is present on the floating diffusion node (e.g., node 205). This type of arrangement may be advantageous when imaging low light level scenes, for example. Circuitry for performing amplifier gain reconfiguration on amplifier 217 has been omitted from FIG. 2 for the sake of simplicity. However, such reconfiguration may be performed by switching in various values of feedback capacitor 219 into and out of the feedback loop between the input and the output of amplifier 217. For example, amplifier 217 may be set to a first gain level (e.g., to provide a first desired gain to signals received from line 223) during a pixel reset interval (e.g., during which reset voltages are sampled from pixel 200) and may be set to a second gain level that is different from the first gain level during an image sampling interval (e.g., during which image level voltages corresponding to the image light captured by photodiode 201 are sampled from pixel 200). If desired, reference voltage $V_{REF}$ 218 may be changed in order to gain a wider voltage swing at the output of amplifier 217. For example, the magnitude of $V_{REF}$ may be set to a relatively high level during the reset and to a relatively low level during readout. In another suitable arrangement, reset transistor 206 may be connected to voltage $V_{dd}$ or may be connected to a separate reference bias line, whereas transistor 207 remains connected to column feedback line 214. Pixel 200 may be formed without any light shield (e.g., because a second pinned diode is not used to store charge as in FIG. 1) on the back side of the image sensor substrate and may exhibit relatively low dark current generation in the arrangement of FIG. 2.

Figure 3:
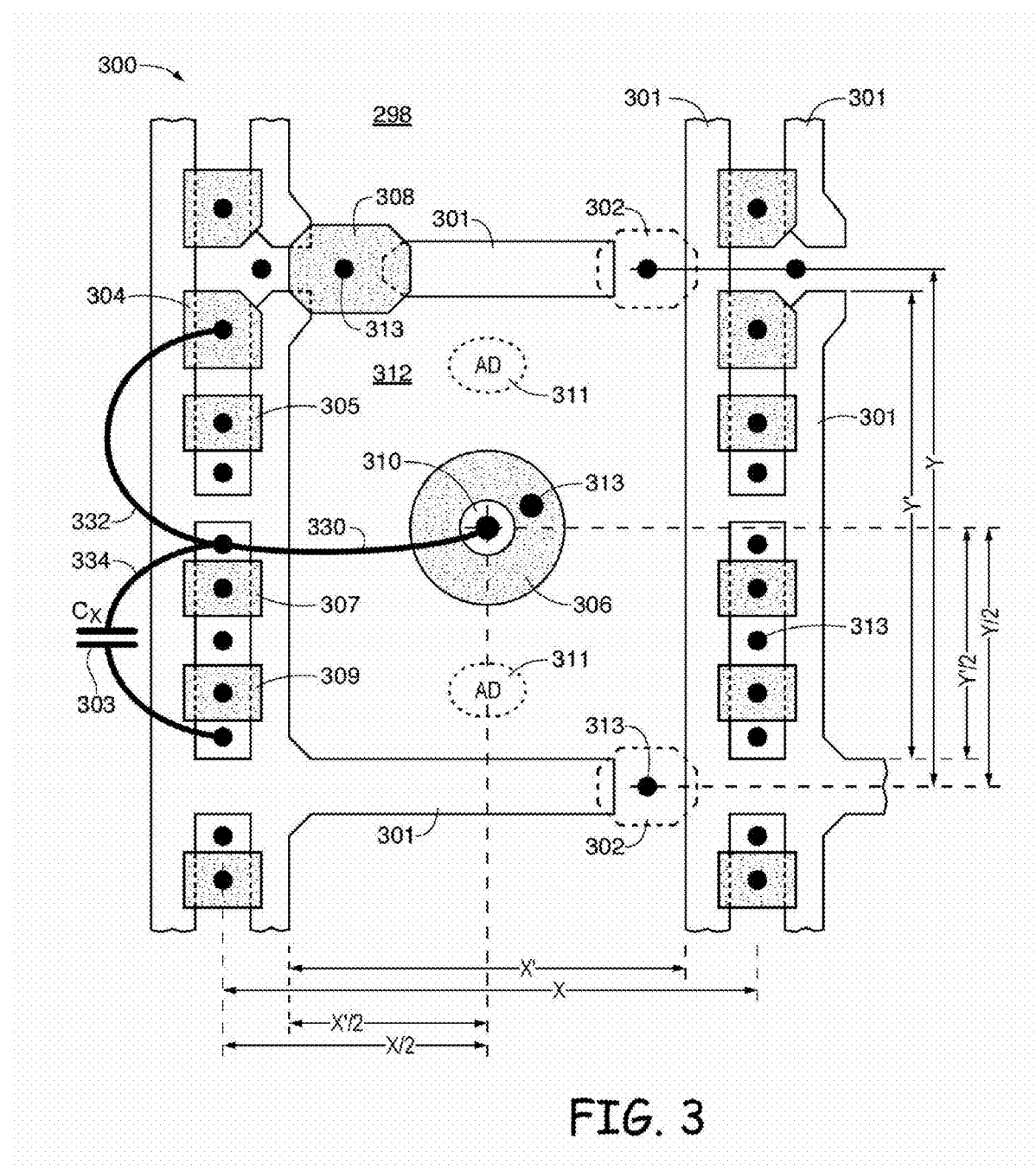
FIG. 3 is an illustrative layout of a global shutter image sensor pixel of the type incorporating a circuit as shown in FIG. 2 having a centrally located floating diffusion node within a photodiode region for increasing shutter efficiency and charge transfer efficiency in accordance with an embodiment of the present invention.

FIG. 3 is an illustrative layout diagram of the topology of a pixel such as pixel circuit 200 of the type shown in FIG. 2. As shown in FIG. 3, pixel 300 (e.g., a layout topology of a pixel such as pixel circuit 200 of FIG. 2) may be formed on semiconductor substrate 298 (e.g., substrate 298 having a front surface at which the corresponding transistor gates are formed and an opposing back surface through which image light is received by the photodiode). Substrate 298 may include shallow isolation trench (STI) pixel isolation region that separates the various active components of pixels 200 from one another and from neighboring pixels in the array. STI region 301 may, if desired, surround active pixel regions in pixel 300 such as photodiode region 312 (e.g., corresponding to photodiode 201 of FIG. 2).

If desired, floating diffusion region (node) 310 (corresponding to floating diffusion 205 of FIG. 2) may be formed at or approximately at the center of photodiode region 312 (e.g., at the center of the semiconductor layout topology of pixel 300) and at the front side of substrate 298. As shown in the example of FIG. 3, pixel 300 may have corresponding orthogonal lengths X and Y and a lateral area given by X*Y. Photodiode 312 may have corresponding orthogonal lengths X' and Y' and may extend across a lateral area X'*Y' at the front side of substrate 298. Photodiode 312 may have a total area given by the lateral photodiode area X'*Y' minus the area of floating diffusion region 310 and the area of charge transfer gate 306. Floating diffusion region 310 may be substantially centered about the center of photodiode 312 (e.g., about the lateral area across which photodiode 312 extends). For example, floating diffusion region 310 may be substantially centered at a distance of approximately X/2 from the left and right sides of pixel 300 on substrate 298 and at a distance of approximately Y/2 from the top and bottom sides of pixel 300 such that region 310 is located at the center of photodiode region 312 and/or pixel 300 in substrate 298 (e.g., region 310 may be substantially centered at a distance of X'/2 from the left and right edges of photodiode region 312 and at a distance of Y'/2 from the top and bottom edges of photodiode region 312).

As shown in FIG. 3, floating diffusion region 310 may be surrounded at the front side of substrate 298 by charge transfer transistor gate 306 (e.g., a gate of corresponding charge transfer transistor 202 shown in FIG. 2). For example, floating diffusion region 310 may be completely surrounded (e.g., bounded on all sides such that the sides of region 310 at the front surface of semiconductor substrate 298 are defined entirely by transfer transistor gate 306). As floating diffusion 310 is completely surrounded by charge transfer gate region 306, region 310 may be sufficiently isolated (e.g., electrically isolated) from photodiode region 312 such that there is no need to form bulky STI regions 301 between diode 312 and floating diffusion region 310. In the example of FIG. 3, floating diffusion 310 and transfer gate region 306 have circular topologies (shapes). This example is merely illustrative. If desired, regions 306 and 310 may have any desired shape, each region may have different shapes, or both regions may have the same shape (e.g., polygonal shapes, rectangular shapes, triangular shapes, elliptical shapes, etc.).

P-type doped regions 302 (e.g., p+type doped semiconductor regions 302) may be formed along the periphery of photodiode region 312 and may provide a connection to ground for the pixel. As shown in FIG. 3, floating diffusion node 310 may have a relatively small lateral area (e.g., an area that is significantly less than the total area X'*Y' of photodiode 312, less than the total area of transfer gate 306, significantly less than the total area X*Y of pixel 300, etc.) so as not to capture many photons that may reach region 310 from the back side of substrate 298. By forming floating diffusion node 310 at the center of pixel 300 at the front side of substrate 298, the efficiency of charge transfer from photodiode 312 to floating diffusion 310 may be improved relative to scenarios where floating diffusion 310 is formed adjacent to or removed from the periphery of photodiode 312, thereby eliminating any possibility of image lag in the system (e.g., a greater percentage of the charge generated by photodiode 312 in response to image light may be successfully passed to floating diffusion 310 than in scenarios where floating diffusion 310 is not formed at a central location within photodiode region 312). In general, the central location of floating diffusion node 310 relative to photodiode 312 as well as the relatively small size and shallow substrate depth of diffusion node 310 may allow for improved shutter efficiency for pixel 300 relative to conventional CMOS image pixels.

If desired, pixel 300 may include anti-blooming/reset transistor gate 308 formed at the periphery of photodiode 312. Pixel 300 may include one or more potential profile adjustment regions such as anti-dome (AD) implant regions 311 (e.g., regions interposed on photodiode region 312). The example of FIG. 3 in which two regions 311 is merely illustrative and, in general, any desired number of AD regions 311 may be formed (e.g., zero, one, two, three, more than three regions, etc.). Anti-blooming/reset transistor 308 and AD implant regions 311 have been omitted from the schematic drawing of FIG. 2 for the sake of simplicity. As shown in FIG. 3, pixel 300 may include poly-silicon gates such as of source follower transistor 304, row select transistor gate 305, first reset transistor gate 307, and second reset transistor gate 309 formed around the periphery of photodiode region 312 (e.g., along a common side of the periphery of photodiode 312 and at the front side of substrate 298). Contact holes (e.g., through one or more metal interconnect/dielectric layers formed over the front surface of substrate 298) to the silicon active regions of substrate 298 and to the gate terminals of the poly-silicon gates are indicated in FIG. 3 by black circles 313.

Floating diffusion 310 may be connected to the gate of source follower transistor 304 via conductive lines 330 and 332 (and corresponding contact holes 313). Coupling capacitor 303 (corresponding to coupling capacitor 208 of FIG. 2) may be coupled to floating diffusion node 310 via conductive lines 330 and 334. Conductive lines 330, 332, and 334 may, for example, be formed within the metal interconnect and dielectric layers formed over the front side of substrate 298 and may thereby allow for the required connections to transistors 206, 207, and 203 (e.g., as shown in FIG. 2) even though floating diffusion node 310 is isolated at the center of photodiode 312 and completely surrounded by transfer gate region 306. The other capacitors of FIG. 2 such as holding capacitor 209 and the corresponding conductive lines formed on the metal interconnect layers over the front side of substrate 298 have been omitted from the layout of FIG. 3 for the sake of clarity. Contacts 313 may have a predetermined area. Floating diffusion 310 may be sufficiently small such that, for example, region 310 has a total area that is substantively equal to that of each contact 313. In scenarios where substrate 298 is formed as a part of a stacked chip image sensor (e.g., in which amplifier circuitry 221 is formed on a separate integrated circuit than pixels 300 that is mounted to the front side of substrate 298), contacts 313 may be used to interconnect substrate 298 and other stacked semiconductor substrates in the imaging system.

The example of FIG. 3 is merely illustrative and does not serve to limit the scope of the present invention. If desired, pixel 300 may have any desired layout with floating diffusion node 306 located approximately at the center of the lateral area occupied by pixel 300 on substrate 298. If desired, the array of pixels may include dark current reference pixels (e.g., pixels used to compensate for dark current in the array) located at the periphery of the array. The dark current reference pixels may include the same floating diffusion regions as the pixels 300 in the main sensing body of the array, but may be formed without photodiode regions 312. If dark reference pixels are sufficiently removed from the array, a light shield may be formed over the dark reference pixels to shield from impinging light.

Pixels with the circuit such as described in FIG. 2 with a pixel topology 300 described in FIG. 3 may be used in a global shutter imaging scheme (mode) and may exhibit relatively high global shutter efficiency, relatively low dark current generation, and relatively small size compared to conventional global shutter image pixels. Pixels described in FIGS. 2 and 3 may be illuminated from the back side of the image pixel substrate without using a light shield (with thereby optimized shutter efficiency) and may, if desired, be stacked with respect to other integrated circuit chips and may be connected to those integrated circuit chips by chip-to-chip interconnects located at the periphery of the array. By forming floating diffusion node 310 at a central location within pixel 300 (e.g., at the center of the lateral area spanned by photodiode region 312 at the front surface of the substrate), pixel 300 may have improved shutter efficiency and charge transfer efficiency relative to pixels having floating diffusion nodes at non-centralized locations in the corresponding pixel area (e.g., thereby allowing for improved noise performance and final image quality).

Figure 4:
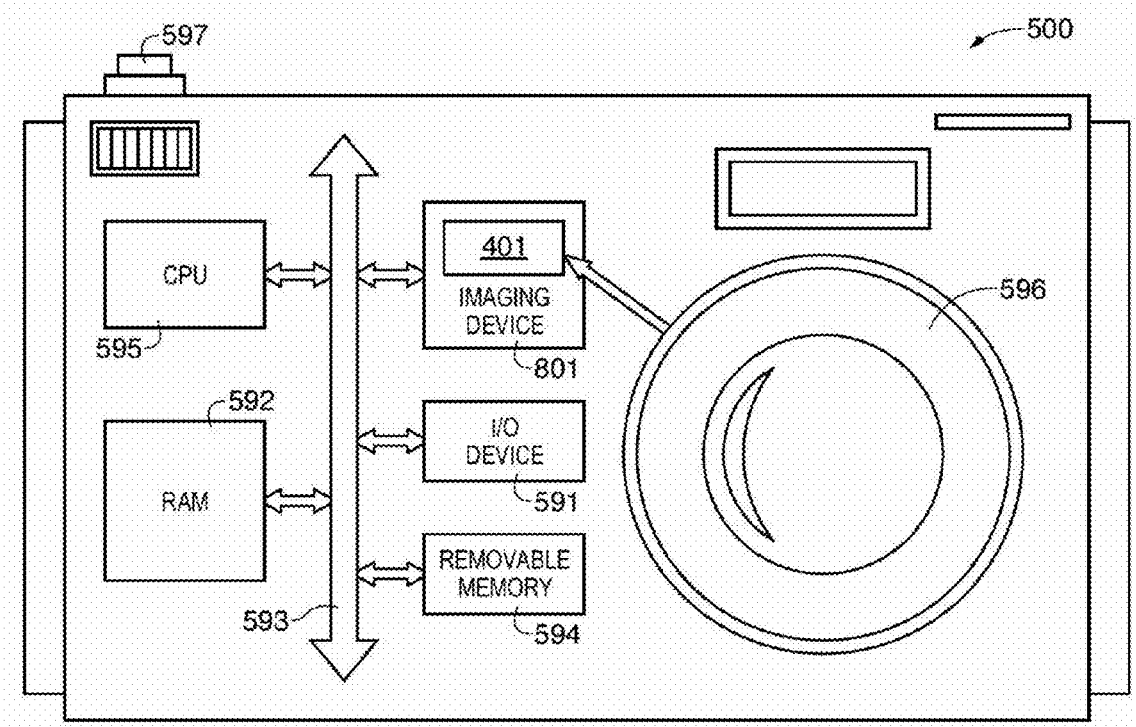
FIG. 4 is a block diagram of a processor system employing the image sensor pixels of FIGS. 2 and 3 in accordance with an embodiment of the present invention.

FIG. 4 shows in simplified form a typical processor system 500, such as a digital camera, which includes an imaging device such as imaging device 801 (e.g., an imaging device 801 such as an image sensor that includes image sensor pixels having centralized floating diffusion regions as described above in connection with FIGS. 2 and 3). Processor system 500 is exemplary of a system having digital circuits that could include imaging device 801. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

Processor system 500, which may be a digital still or video camera system, may include a lens such as lens 596 for focusing an image onto a pixel array when shutter release button 597 is pressed. Processor system 500 may include a central processing unit such as central processing unit (CPU) 595. CPU 595 may be a microprocessor that controls camera functions and one or more image flow functions and communicates with one or more input/output (I/O) devices 591 over a bus such as bus 593. Imaging device 801 may also communicate with CPU 595 over bus 593. System 500 may include random access memory (RAM) 592 and removable memory 594. Removable memory 594 may include flash memory that communicates with CPU 595 over bus 593. Imaging device 801 may be combined with CPU 595, with or without memory storage, on a single integrated circuit or on a different chip. Although bus 593 is illustrated as a single bus, it may be one or more buses or bridges or other communication paths used to interconnect the system components.

Various embodiments have been described illustrating a back side illuminated imaging system (e.g., image sensor pixel array) that can operate in a global shutter mode with improved shutter efficiency, reduced dark current generation, and optimized semiconductor substrate area consumption relative to conventional global shutter image sensor pixel arrays. The image sensor pixel array may include image sensor pixel circuitry that includes a substrate having opposing front and back surfaces. The image sensor pixel array may be illuminated with image light through the back surface.

The image sensor pixels in the array may include a photodiode region that generates charge in response to image light. The photodiode may extend across a lateral area of the semiconductor substrate at the front surface of the substrate. A floating diffusion region may be centered about a location within the photodiode region. For example, the floating diffusion region may be formed at a location on the semiconductor substrate that is substantially centered with respect to the lateral area across which the photodiode extends (e.g., the floating diffusion region may be centered at the front surface of the substrate with respect to the corresponding photodiode). A charge transfer gate may be formed within the lateral area across which the photodiode extends on the semiconductor substrate. The charge transfer gate may be interposed between the floating diffusion region and the photodiode and configured to transfer the generated charge from the photodiode to the floating diffusion region. For example, the charge transfer gate may completely surround the floating diffusion region at the front surface of the substrate such that the floating diffusion region and the charge transfer gate are centered about the center of the photodiode in the substrate. In this way, the charge transfer gate may sufficiently isolate the floating diffusion region from the photodiode.

First and second reset transistor gates may be formed at a periphery of the lateral area across which the photodiode extends (e.g., at the periphery of the photodiode region at the front surface of the substrate). A conductive line may be coupled between the floating diffusion region and the reset transistor gate. A coupling capacitor may be coupled between the additional reset transistor gate and the floating diffusion region. If desired, the conductive line and the coupling capacitor may be formed in an interconnect layer attached to the front side of the semiconductor substrate. The pixel may include a source follower transistor, a pixel addressing transistor coupled to a source terminal of the source follower transistor, and an additional conductive line coupled between the source follower transistor and the floating diffusion node. The addressing transistor may be coupled to an input of a column feedback amplifier and the column feedback amplifier may provide a pixel reset voltage to the reset transistor and the additional reset transistor over a column feedback line. An error voltage holding capacitor may be coupled between the coupling capacitor and a drain terminal of the source follower transistor, a reference voltage terminal, or a ground terminal. The column feedback amplifier may generate a kTC-reset noise correcting signal that is stored on the error voltage holding capacitor during pixel reset operations. The image sensor pixel may be formed in an array of image sensor pixels that is configured to operate in global shutter mode.

By centering the floating diffusion node with respect to the photodiode, the image sensor pixels may have improved shutter efficiency and charge transfer efficiency relative to pixels having floating diffusion nodes at non-centralized locations in the corresponding pixel area (e.g., thereby allowing for improved noise performance and final image quality).

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor pixel formed on a semiconductor substrate, comprising:
    a photodiode that generates charge in response to image light, wherein the photodiode extends across a lateral area of the semiconductor substrate;
    a floating diffusion region formed at a location on the semiconductor substrate that is substantially centered with respect to the lateral area; and
    a charge transfer gate that is formed within the lateral area on the semiconductor substrate, wherein the charge transfer gate is interposed between the floating diffusion region and the photodiode and configured to transfer the generated charge from the photodiode to the floating diffusion region.

2. The image sensor pixel defined in claim 1, wherein the charge transfer gate completely surrounds the floating diffusion region and is configured to electrically isolate the floating diffusion region from the photodiode.

3. The image sensor pixel defined in claim 2, further comprising:
    a reset transistor gate formed at a periphery of the lateral area; and
    a conductive line coupled between the floating diffusion region and the reset transistor gate.

4. The image sensor pixel defined in claim 3, further comprising:
    an additional reset transistor gate formed at the periphery of the lateral area; and
    a coupling capacitor coupled between the additional reset transistor gate and the floating diffusion region.

5. The image sensor pixel defined in claim 4, wherein the photodiode generates charge in response to image light received through a back side of the semiconductor substrate and wherein the conductive line and the coupling capacitor are formed in an interconnect layer attached to a front side of the semiconductor substrate that opposes the back side of the semiconductor substrate.

6. The image sensor pixel defined in claim 3, further comprising:
   a source follower transistor;
   an pixel addressing transistor coupled to a source terminal of the source follower transistor; and
   an additional conductive line coupled between the source follower transistor and the floating diffusion node.

7. The image sensor pixel defined in claim 6, wherein the pixel addressing transistor is coupled to an input of a column feedback amplifier and wherein the column feedback amplifier is configured to provide a pixel reset voltage to the reset transistor and the additional reset transistor over a column feedback line.

8. The image sensor pixel defined in claim 7, further comprising:
   an error voltage holding capacitor coupled between the coupling capacitor and one of a drain terminal of the source follower transistor, a reference voltage terminal, and a ground terminal, wherein the column feedback amplifier is configured to generate a kTC-reset noise correcting signal that is stored on the error voltage holding capacitor during pixel reset operations.

9. The image sensor pixel defined in claim 8, wherein the feedback amplifier is configured to apply a first gain during an image signal scanning interval during which image signals corresponding to the image light are received at the feedback amplifier circuitry from the pixel addressing transistor and a second gain that is different from the first gain during a pixel reset interval during which the feedback amplifier circuitry is configured to reset the floating diffusion node to a reset voltage, and wherein the feedback amplifier circuitry is provided with a first reference bias voltage during the image signal scanning interval and a second reference bias voltage during the pixel reset interval.

10. The image sensor pixel defined in claim 7, wherein the feedback amplifier is formed on an additional semiconductor substrate that is separate from the semiconductor substrate on which the image sensor pixel is formed, wherein the additional semiconductor substrate is mounted to a front side of the substrate, and wherein the photodiode generates the charge in response to image light received through a back side of the semiconductor substrate that opposes the front side of the semiconductor substrate.

11. The image sensor pixel defined in claim 2, wherein the floating diffusion region has a first total area at a front side of the semiconductor substrate, the charge transfer gate has a second total area at the front side that is greater than the first total area, and the photodiode has a third total area at the front side that is greater than the second total area.

12. The image sensor pixel defined in claim 1, wherein the image sensor pixel is formed in an array of image sensor pixels and wherein the image sensor pixel and the array of image sensor pixels are configured to operate in global shutter mode.

13. A back-side illuminated image sensor pixel formed on a semiconductor substrate, comprising:
    a photodiode region configured to generate charge in response to image light received through a back side of the semiconductor substrate, wherein the photodiode region extends across a length and a width on the semiconductor substrate at a front side of the semiconductor substrate, wherein the length and the width define a lateral photodiode area;
    a floating diffusion node, wherein the floating diffusion node is centered about a location within the lateral photodiode area at the front side of the semiconductor substrate; and
    a charge transfer gate that completely surrounds the floating diffusion node at the front side of the semiconductor substrate and that is configured to transfer the generated charge from the photodiode to the floating diffusion node.

14. The back-side illuminated image sensor pixel defined in claim 13, wherein the charge transfer gate is centered about the location within the lateral photodiode area at which the floating diffusion node is centered.

15. The back-side illuminated image sensor pixel defined in claim 14, wherein the location within the lateral photodiode area at which the floating diffusion node is centered is located approximately halfway across the length and halfway across the width of the photodiode region so that the location within the lateral photodiode area is substantially centered with respect to the lateral photodiode area.

16. The back-side illuminated image sensor pixel defined in claim 13, wherein the floating diffusion node and the charge transfer gate are formed at the front side of the semiconductor substrate, and wherein the front side of the semiconductor substrate opposes the back side of the semiconductor substrate.

17. The back-side illuminated image sensor pixel defined in claim 16, wherein the lateral photodiode area has a periphery, further comprising:
    a first reset gate at the front side of the semiconductor substrate;
    a second reset gate at the front side of the semiconductor substrate; and
    a source follower transistor, wherein the first and second reset transistors and the source follower transistor are formed adjacent to the periphery of the lateral photodiode area and separated from the lateral photodiode area by an isolation trench structure.

18. The back-side illuminated image sensor pixel defined in claim 17, wherein the first and second reset gates and the source follower transistor are formed at a common side of the lateral photodiode area, and wherein metal interconnect layers are formed over the front side of the semiconductor substrate, the back-side illuminated image sensor pixel further comprising:
    a conductive line formed in the metal interconnect layers that couples the floating diffusion node to the source follower transistor and the first reset gate; and
    a coupling capacitor formed in the metal interconnect layers that couples the floating diffusion node to the second reset gate.

19. A system, comprising:
    a central processing unit;
    memory;
    input-output circuitry; and
    an imaging device operable in a global shutter mode, wherein the imaging device comprises:
        a pixel array having at least one pixel circuit formed in a semiconductor substrate, and
        a lens that focuses an image onto the pixel array, wherein the at least one pixel circuit comprises:
            a photosensitive region that generates charge in response to image light received through a back side of the pixel array, wherein the photosensitive region extends across a lateral area of the semiconductor substrate;

a charge storage region formed at a location on the semiconductor substrate that is substantially centered with respect to the lateral area across which the photosensitive region extends; and a charge transfer gate that is formed within the lateral area, wherein the charge transfer gate is interposed between the charge storage region and the photodiode such that the charge transfer gate completely surrounds the charge storage region, and wherein the charge transfer gate is configured to transfer the generated charge from the photodiode to the charge storage region.

20. The system defined in claim 19, wherein the at least one pixel circuit further comprises:

first and second reset transistor gates at a front side of the semiconductor substrate that opposes the back side of the semiconductor substrate, wherein the first and second reset transistor gates are coupled to the charge storage region;

a source follower transistor at the front side of the semiconductor substrate that has a gate terminal coupled to the charge storage region, a source terminal, and a drain terminal;

feedback amplifier circuitry having an input and an output;

a row select gate at the front side of the semiconductor substrate that is coupled between the source terminal of the source follower transistor and the input of the feedback amplifier circuitry; and a column feedback line coupled between the output of the feedback amplifier circuitry and the first and second reset transistor gates, wherein the feedback amplifier circuitry is configured to generate a pixel reset voltage.

* * * * *